United States Patent
Ghosh

(10) Patent No.: US 6,771,508 B1
(45) Date of Patent: Aug. 3, 2004

(54) METHOD AND APPARATUS FOR COOLING AN ELECTRONIC COMPONENT

(75) Inventor: Prosenjit Ghosh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/367,239

(22) Filed: Feb. 14, 2003

(51) Int. Cl.[7] ............................................. H05K 7/20
(52) U.S. Cl. ..................... 361/704; 361/703; 361/707; 361/708; 361/709; 361/710; 257/706; 257/714; 165/80.3; 165/80.4; 165/104.26; 165/185; 174/15.2; 174/16.3
(58) Field of Search ................................. 361/699, 700, 361/703, 704, 709, 710, 708; 257/722; 174/15.2, 16.3; 165/80.3, 185

(56) References Cited

U.S. PATENT DOCUMENTS

| | | | | |
|---|---|---|---|---|
| 4,838,347 A | * | 6/1989 | Dentini et al. ............. 165/185 |
| 5,138,523 A | * | 8/1992 | Benck et al. ............... 361/687 |
| 5,424,913 A | * | 6/1995 | Swindler .................... 361/687 |
| 5,625,229 A | * | 4/1997 | Kojima et al. .............. 257/712 |
| 6,065,530 A | * | 5/2000 | Austin et al. .............. 165/80.3 |
| 6,239,972 B1 | * | 5/2001 | Tehan et al. ................ 361/704 |
| 6,256,193 B1 | * | 7/2001 | Janik et al. ................. 361/683 |
| 6,308,771 B1 | * | 10/2001 | Tavassoli .................... 165/80.3 |
| 6,310,771 B1 | * | 10/2001 | Chien ......................... 361/697 |
| 6,390,181 B1 | * | 5/2002 | Hall et al. .................. 165/80.3 |
| 6,459,576 B1 | * | 10/2002 | Bhatia et al. ............... 361/687 |
| 6,490,160 B2 | * | 12/2002 | Dibene et al. .............. 361/700 |
| 6,545,866 B2 | * | 4/2003 | Katsui et al. ............... 361/690 |
| 6,684,501 B2 | * | 2/2004 | Ellsworth et al. ......... 29/890.03 |

* cited by examiner

Primary Examiner—Boris Chérvinsky
(74) Attorney, Agent, or Firm—Blakely, Sokoloff, Taylor & Zafman LLP

(57) ABSTRACT

In one embodiment, the invention provides a system. The system comprises using a plurality of heat absorbing fins to absorb heat from an electronic component of a substrate-mounted electronic assembly; and transporting the absorbed heat to a material of an enclosure for the electronic assembly where it is dissipated.

23 Claims, 6 Drawing Sheets

METHOD AND APPARATUS FOR COOLING AN ELECTRONIC COMPONENT

FIELD OF THE INVENTION

This invention relates to mobile computing systems. In particular, it relates to a thermal management solution for such systems.

BACKGROUND

Mobile computing systems, such as notebook or laptop computers, and pen-based computing systems (Tablet PC's) generally comprise a large number of electronic components housed within an enclosure that has a comparatively small form factor.

These electronic components generate significant quantities of heat during operation. Therefore, there is a need for some thermal management solution to dissipate the heat in an efficient manner so that the components may operate normally.

Existing thermal management solutions generally include a heat sink comprising a plurality of cooling fins which are physically mounted to a heat generating component that requires cooling. The heat sink is of a conductive material and draws heat from the heat generating component by conduction where after it radiates the heat through the cooling fins.

The above describe a thermal management solution and requires the heat generating component to have sufficient surface area to permit the mounting of the heat sink thereon. However, in some cases a heat generating component may lack the required surface area to permit such a mounting, thereby rendering said thermal management solution inutile.

This can be a problem, particularly where there is a large concentration of heat generating components that each individually lack the surface dimension to permit mounting of a heat sink thereon.

DETAILED DESCRIPTION

Figure 1:
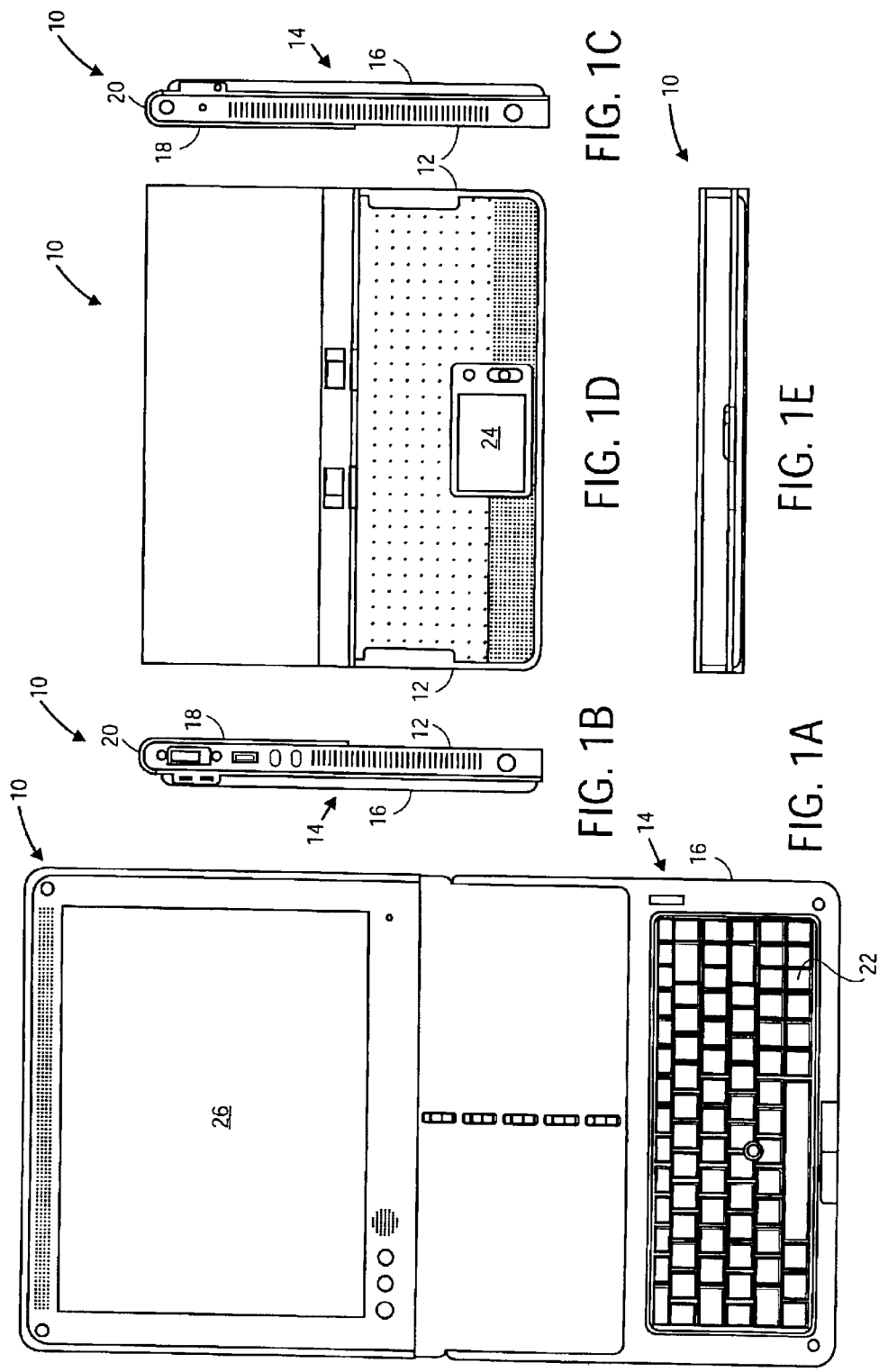
FIGS. 1A to 1E show various views of a system in accordance with one embodiment of the invention.

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

FIGS. 1A to 1E of the drawings show various views of a mobile computing system 10 in accordance with one embodiment of the invention. The mobile computing system is a pen-based computing system and includes a tablet unit 12 and a base unit 14. The base unit 14 comprises a first panel 16 and a second panel 18 hingedly secured together by a hinge 20. The first panel 16 bears a keyboard 22 which is used to input data into the tablet unit 12 when the system 10 is operated in a laptop mode.

The tablet unit 12 is generally rectangular and has a small form factor. Components of the tablet unit 12 include various processing and memory components mounted on a motherboard substrate, a mini-screen 24, and a larger screen 26. The large screen 26 is coupled with a digitizer (not shown). In use, in a tablet mode, a user may enter handwriting directly on the screen 26. The handwriting is digitized by the digitizer and handwriting recognition software then converts the handwriting into text.

Figure 2:
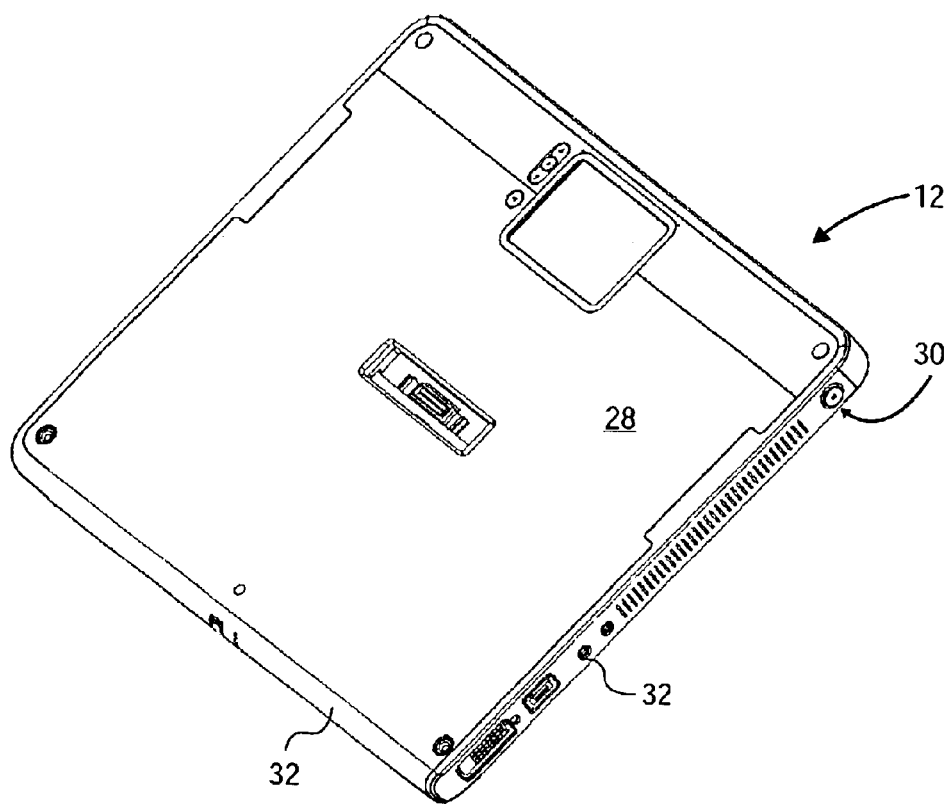
FIG. 2 shows a tablet unit of the system of FIGS. 1A to 1E, in greater detail.
Figure 3:
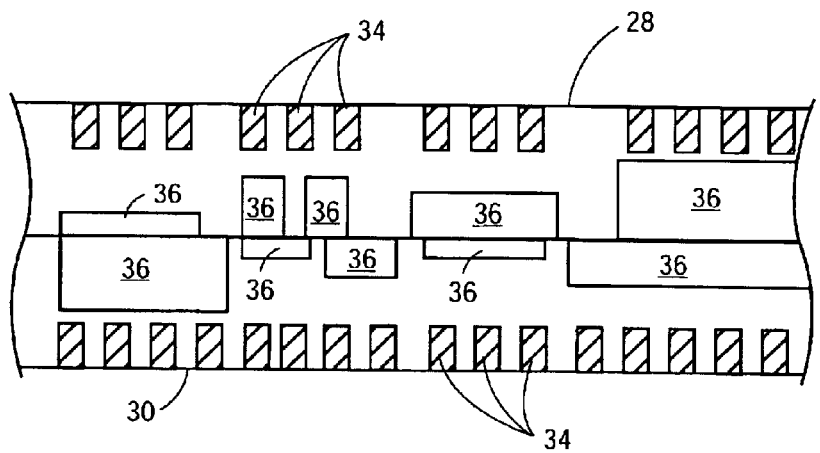
FIG. 3 shows a partial cross-sectional view through the tablet unit of the system of FIGS. 1A to 1E, in accordance with one embodiment of the invention.

Because of its compact form factor, the tablet unit 12 includes a number of heat producing components that are concentrated in a small area. Therefore, there is a need for some thermal management solution to distribute the heat produced by the heat producing components. Thus, in one embodiment of the present invention, the tablet unit 12 is housed within an enclosure which incorporates a thermal management solution. In this embodiment, the enclosure comprises a generally rectangular hollow-form body comprising a top wall 28, a bottom wall 30, and a peripheral side wall 32 (see FIG. 2). Each of the walls 28, 30 and 32 may be of aluminum. The top and bottom walls 28, 30 include a plurality of heat absorbing thermal fins 34 (see FIG. 3, where only a few of the fins have been labelled) to absorb heat from an electronic components 36 of a substrate mounted electronic assembly, for example, a motherboard. The heat absorbing fins 34 transfer the absorbed heat to a material of the enclosure, i.e., a portion of the top or bottom wall 28, 30 to which the heat absorbing fins 34 are mounted. The heat is then dissipated from the top and bottom walls 28, 30, e.g., via radiation. The top and bottom walls 28, 30 thus function as a heat spreader. In other embodiments, a heat spreader in the form of a block of material of high thermal conductivity may be connected to the heat absorbing fins. In cases where, due to space constraints, it is not possible to locate a heat sink or reservoir in close proximity to the heat absorbing fins, the heat spreader may include a heat transfer mechanism to transport heat absorbed from the heat producing component to a heat sink or reservoir located at a remote location some distance away. The heat transfer mechanism may, in some embodiments, include a heat pipe including internal passages filled with a heat exchanging fluid, e.g., water, ethanol.

In one embodiment, the heat absorbing fins 34 stand proud of the top or bottom walls 28, 30 of the enclosure and may be integrally formed therewith. In other embodiments, the heat absorbing fins 34 may be secured to the top or bottom walls 28, 30 using a joining technique, for example, welding.

In some embodiments, the heat absorbing fins 34 have a cross-sectional area, that decreases in the direction away from the top or bottom walls 28, 30 of the enclosure. In other embodiments, the heat absorbing fins may have a frusto-conical shape.

Figure 4A:
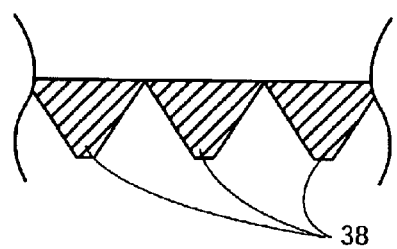
FIGS. 4A to 4C show cross-sectional profiles of various thermal fins in accordance with some embodiments of the invention.
Figure 4B:
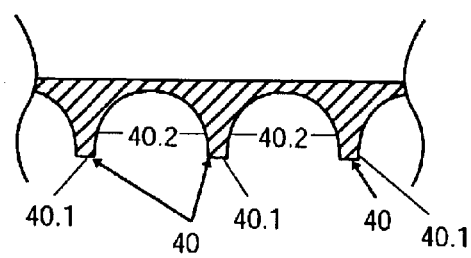

In yet other embodiments, the shape of the heat absorbing fins 34 may be such as to increase a surface area of each fin, thereby to promote the heat absorbing capability of the fin. For example, as indicated in FIG. 4A of the drawings, each fin 38 has an inverted frusto-conical shape which increases the heat absorbing surface of each fin. In another embodiment, shown in FIG. 4B of the drawings, each fin 40 may have a generally rectangular top 40.1 and concave sides 40.2 so that a cross-sectional area of each fin 40 increases in a direction away from the top 40.1. The shape of each fin 40 increases its surface area by which it absorbs heat.

Figure 4C:
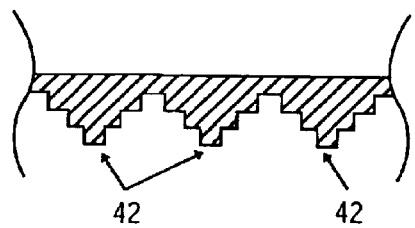

In the embodiment shown in FIG. 4C of the drawings, fins 42 are generally triangular in cross-section. However, a boundary wall of each fin is stepped to increase its surface area.

Figure 5A:
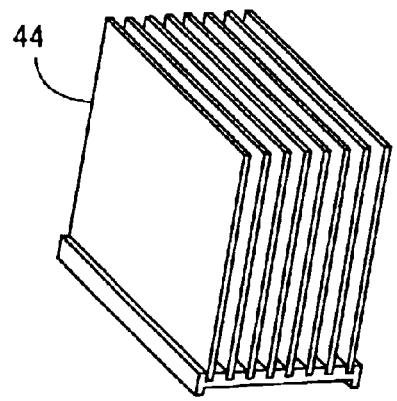
FIGS. 5A to 5D show perspective views of different thermal fin configurations, in accordance with the invention.
Figure 5B:
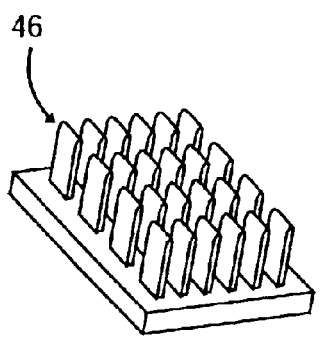
Figure 5C:
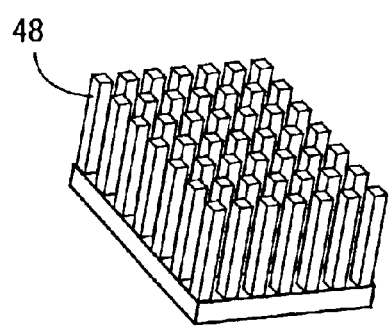
Figure 5D:
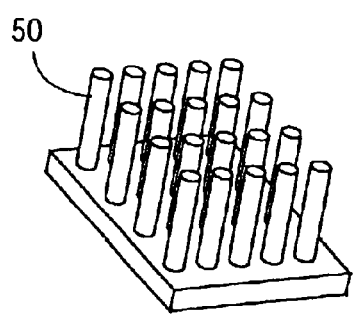

FIGS. 5A to 5D show other fin configurations. For example, each fin may define a blade 44 (see FIG. 5A), be disposed in a fluted configuration 46 as can be seen in FIG. 5B, define a rectangular pin 48 (see FIG. 5C), or define a cylindrical pin 50 (see FIG. 5D).

In order to promote the heat absorbing capabilities of each fin, the fins may be augmented using various augmentation techniques to cause airflow through the fins to be turbulent or non-laminar.

Figure 6A:
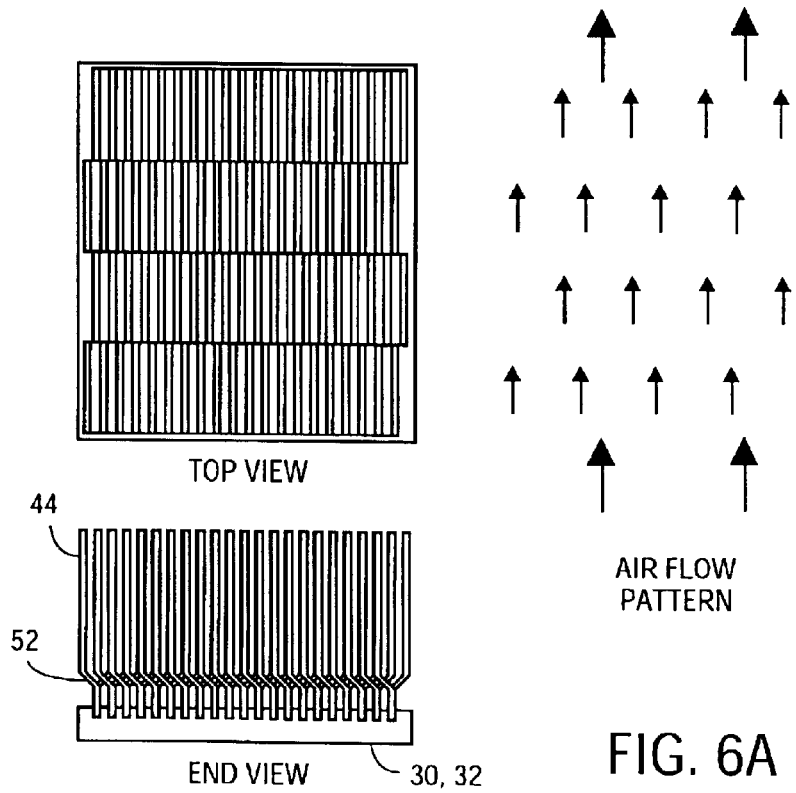
FIGS. 6A and 6B illustrate augmentation techniques for blade-type thermal fins, in accordance with some embodiments of the invention.
Figure 6B:
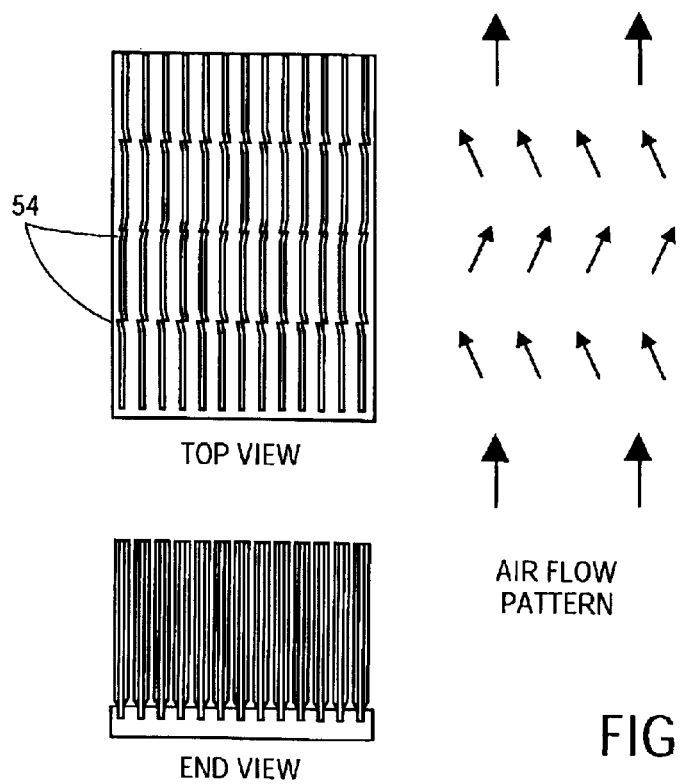

FIGS. 6A and 6B of the drawings show augmentation techniques that may be used in the case of blade fins 44. As can be seen in FIG. 6A, each blade fin 44 has a bend 52 adjacent an end thereof which is fast with the top or bottom wall 30, 32 of the enclosure. Furthermore, a total length of each blade along which the airflows, is divided into four sections. In one embodiment, each consecutive section is laterally offset to cause turbulence in the airflow.

FIG. 6B illustrates an augmentation technique which is basically the same as the augmentation technique illustrated with reference to FIG. 6A of the drawings except that edges 54 of each blade fin 44 are curved to cause increased turbulence of the airflow.

Figure 7A:
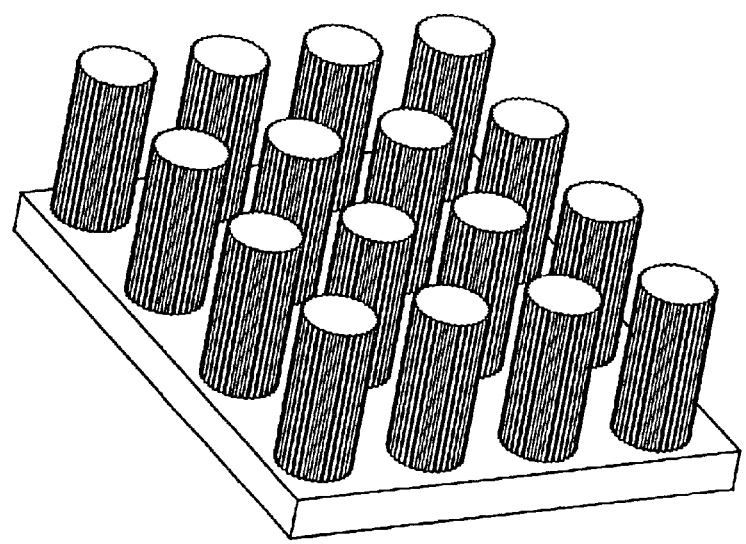
FIGS. 7A and 7B illustrate augmentation techniques for pin-type thermal fins in accordance with another embodiment of the invention.
Figure 7B:
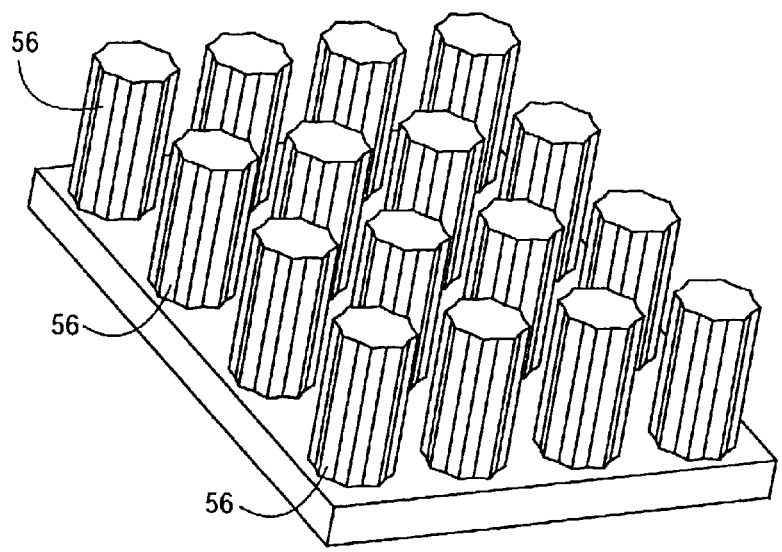

Referring now to FIGS. 7A and 7B of the drawings, augmentation techniques suitable in the case of pin fins are shown. As can best be seen from FIG. 7B of the drawings, instead of a circular cross-section, each pin fin has a plurality of faces 44 and appears polygonal in cross-section. Each face 56 of the augmented pin fin serves to deflect airflow in a different direction, thereby increasing turbulence. If greater turbulence is desired, then the number of faces that define the polygon may be increased, as is shown in FIG. 7A of the drawings.

In an embodiment (not shown), the heat absorbing fins may include internal passages filled with a heat exchanging fluid, e.g., water, or ethanol. In use, the heat exchanging fluid serves to transport heat away from the heat producing component. This embodiment thus, functions as a heat pipe.

In yet another embodiment (not shown), each heat absorbing fin may be of a composite construction comprising a conductive outer region that surrounds an inner region of an anisotropic material that has increased thermal conductivity along a longitudinal axis of the fin. The conductive outer region may comprise high conductivity materials such as aluminum, copper, manganese, etc., whereas the inner region may comprise, e.g., carbon-based materials such as graphite, or carbon-copper composites. In use, the outer conductive region draws heat from the heat producing component, and the inner region transports the heat along the longitudinal axis of the fin. In some cases, the materials for the fins of composite construction may be selected to reduce the weight of the fins.

Although the present invention has been described with reference to specific exemplary embodiments, it will be evident that the various modification and changes can be made to these embodiments without departing from the broader spirit of the invention as set forth in the claims. Accordingly, the specification and drawings are to be regarded in an illustrative sense rather than in a a restrictive sense.

What is claimed is:

1. A method of cooling an electronic component, the method comprising:

using a plurality of heat absorbing fins to absorb heat from an electronic component of a substrate-mounted electronic assembly;

wherein each fin is of a composite construction comprising a conductive outer region that surrounds an inner region of an anisotropic material that has increased thermal conductivity along a longitudinal axis of the fin; and transporting the absorbed heat to a material of an enclosure for the electronic assembly where it is dissipated.

2. The method of claim 1, wherein transporting the absorbed heat comprises mounting the heat absorbing fins to a panel of the enclosure so that the fins stand proud of the panel.

3. The method of claim 2, wherein the heat absorbing fins are integrally formed with the panel.

4. The method of claim 2, wherein the heat absorbing fins are shaped to have a cross-sectional area that decreases in a direction away from the panel.

5. The method of claim 4, wherein the heat absorbing fins have a frusto-conical shape.

6. The method of claim 1, wherein the heat absorbing fins are augmented to improve turbulent airflow therethrough.

7. The method of claim 4, further comprising contouring each heat absorbing fin to increase its surface area.

8. The method of claim 7, wherein the contouring comprises forming grooves in an outer surface of each heat absorbing fin.

9. A cooling mechanism for cooling an electronic component, the arrangement comprising:

a plurality of heat absorbing fins disposed adjacent a heat producing electronic component;

wherein each fin is of a composite construction comprising a conductive outer region that surrounds an inner region of an anisotropic material that has increased thermal conductivity along a longitudinal axis of the fin; and a heat spreader connected to the heat absorbing fins to spread heat absorbed by the heat absorbing fins.

10. The cooling mechanism of claim 9, wherein each heat absorbing fin comprises a heat transfer mechanism to transfer the heat to a remote location.

11. The cooling mechanism of claim 10, wherein the heat transfer mechanism comprises a heat exchange fluid contained in an internal passage of the heat absorbing fin.

12. The cooling mechanism of claim 9, wherein the heat spreader is defined by a section of a wall of an enclosure for the electronic component.

13. The cooling mechanism of claim 10, wherein the heat absorbing fins are integrally formed with the wall.

14. A system, comprising:
- a heat producing electronic component;
- a cooling mechanism to cool the electronic component, the cooling mechanism including a plurality of heat absorbing fins disposed adjacent the heat producing electronic component, and a heat spreader fast with the heat absorbing fins to spread heat absorbed by the heat absorbing fins; and
- wherein each fin is of a composite construction comprising a conductive outer region that surrounds an inner region of an anisotropic material that has increased thermal conductivity along a longitudinal axis of the fin.

15. The system of claim 14, wherein the heat spreader is defined by a section of the wall of an enclosure for the heat producing component.

16. The system of claim 14, wherein the heat absorbing fins are augmented to promote turbulent airflow therethrough.

17. An enclosure for an electronic component, the enclosure comprising:
- a hollow body shaped and dimensioned to house the electronic component, the body comprising front and rear panels, and a peripheral side wall;
- a plurality of heat absorbing fins located within the hollow body to absorb heat from the electronic component and to transfer the heat to the hollow body; and
- wherein each fin is of a composite construction comprising a conductive outer region that surrounds an inner region of an anisotropic material that has increased thermal conductivity along a longitudinal axis of the fin.

18. The enclosure of claim 17, wherein the heat absorbing fins are integrally formed with at least one of the front and rear panels.

19. The enclosure of claim 17, wherein a cross-sectional area of each heat absorbing fin decreases in a direction away from the hollow body.

20. The enclosure of claim 17, wherein the heat absorbing fins are augmented to promote turbulent airflow therethrough.

21. A system, comprising:
- a processing component;
- a display component;
- an enclosure housing the processing and display component, wherein the enclosure comprises a hollow body, and a plurality of heat absorbing fins mounted to the body to draw heat from the processing component into the hollow body; and
- wherein each fin is of a composite construction comprising a conductive outer region that surrounds an inner region of an anisotropic material that has increased thermal conductivity along a longitudinal axis of the fin.

22. The system of claim 21, wherein the heat absorbing fins decrease in cross-sectional area along an axis extending away from the hollow body.

23. The system of claim 21, wherein the heat absorbing fins are augmented to promote turbulent airflow therethrough.

* * * * *